US007656333B2

(12) United States Patent
Bruin (10) Patent No.: US 7,656,333 B2
(45) Date of Patent: Feb. 2, 2010

(54) DIGITAL-TO-ANALOG CONVERTER OF THE FINITE IMPULSE RESPONSE TYPE

(75) Inventor: Paulus Petrus Franciscus Maria Bruin, Nijmegen (NL)

(73) Assignee: NXP B.V., Eindhoven (NL)

(*) Notice: Subject to any disclaimer, the term of this patent is extended or adjusted under 35 U.S.C. 154(b) by 76 days.

(21) Appl. No.: 12/065,625

(22) PCT Filed: Aug. 23, 2006

(86) PCT No.: PCT/IB2006/052923

§ 371 (c)(1),
(2), (4) Date: Mar. 4, 2008

(87) PCT Pub. No.: WO2007/029130

PCT Pub. Date: Mar. 15, 2007

(65) Prior Publication Data

US 2008/0266156 A1    Oct. 30, 2008

(30) Foreign Application Priority Data

Sep. 5, 2005    (EP) .................................. 05108102

(51) Int. Cl.
*H03M 1/66*    (2006.01)
(52) U.S. Cl. ...................................... 341/144; 341/145
(58) Field of Classification Search ................. 341/120, 341/118, 144, 143, 145

See application file for complete search history.

(56) References Cited

U.S. PATENT DOCUMENTS

| 5,323,157 | A |   | 6/1994  | Ledzius et al.              |
|-----------|---|---|---------|-----------------------------|
| 5,592,165 | A | * | 1/1997  | Jackson et al. ...... 341/143 |
| 6,177,896 | B1| * | 1/2001  | Min .................... 341/143 |
| 6,177,897 | B1| * | 1/2001  | Williams, III ....... 341/150 |
| 6,501,408 | B2|   | 12/2002 | Groeneweg                   |
| 2002/0140588 | A1 | | 10/2002 | Groeneweg                   |

FOREIGN PATENT DOCUMENTS

EP        0359315 A1    3/1990

* cited by examiner

*Primary Examiner*—Brian Young (57) ABSTRACT

In a signal processing arrangement, a digital-to-analog converter (DAC1) of the finite impulse response type converts a serial bitstream (BSL) into an analog output signal (AL). The digital-to-analog converter (DAC1) comprises at least two current source arrays (CCA1, CCA2). In a first current source array (CCA1), a current definition cell (CD1) generates a first basic current, and a plurality of first current copy cells ( . . . , CC40, CC41, . . . ) provide respective scaled copies of the first basic current to constitute first filter coefficient currents ( . . . , IP40, IP41, . . . ). In a further current source array (CCA2), a further current definition cell (CD2) generates a further basic current, and a plurality of current further copy cells (CC1, CC2, . . . , CC80) provide respective scaled copies of the further basic current to constitute further filter coefficient currents (IP1, IP2, . . . , IP80). A switch-and-shift array (XSA) individually passes the respective filter coefficient currents (IP1, IP2, . . . , IP40, IP41, . . . , IP80) to a signal output (CVC), or to another point (DLD), depending on respective successive bit values in the serial bitstream (BSL).

7 Claims, 4 Drawing Sheets

DIGITAL-TO-ANALOG CONVERTER OF THE FINITE IMPULSE RESPONSE TYPE

FIELD OF THE INVENTION

An aspect of the invention relates to a signal processing arrangement that comprises a digital-to-analog converter of the finite impulse response type. Such a digital-to-analog converter converts a serial bitstream into an analog output signal. The signal processing arrangement may be, for example, a so-called settop box or another type of receiver that derives video, audio, and other data, from a selected channel in a radiofrequency spectrum. The digital-to-analog converter may form part of, for example, an audio circuit that provides an analog audio output signal for a loudspeaker. Other aspects of the invention relate to a method of signal processing, and an information-rendering system.

BACKGROUND OF THE INVENTION

U.S. Pat. No. 6,501,408 describes a finite impulse response digital-to-analog converter (FIRDAC). Generally speaking, a FIRDAC comprises a shift register with a large number of stages that receive a bitstream input signal, which is a serial datastream with one bit amplitude resolution. Each stage switches a dedicated current source on or off. The currents thus generated by all of the stages of the shift register are added to generate an output current of the FIRDAC. Accordingly, each stage produces an output current contributing to the overall output current of the FIRDAC. However, the stages of the FIRDAC do not all contribute in the same extent. In order to obtain a desired filter characteristic, each stage has an associated weighing coefficient, which is constituted by the magnitude of the output current of the current source.

SUMMARY OF THE INVENTION

It is an object of the invention to provide an improved digital-to-analog converter of the finite impulse response type. The invention is defined by the independent claims. The dependent claims define advantageous embodiments.

According to an aspect of the invention, a signal processing arrangement comprises a digital-to-analog converter of the finite impulse response type that has the following characteristics. The digital-to-analog converter comprises at least two current source arrays. In a first current source array, a current definition cell generates a first basic current, and a plurality of first current copy cells provide respective scaled copies of the first basic current to constitute first filter coefficient currents. In a further current source array, a further current definition cell generates a further basic current, and a plurality of current further copy cells provide respective scaled copies of the further basic current to constitute further filter coefficient currents. A switch-and-shift array individually passes the respective filter coefficient currents to a signal output, or to another point, depending on respective successive bit values in the serial bitstream.

The invention takes the following aspects into consideration. A digital-to-analog converter of the finite impulse response typically comprises a current source arrangement that provides a plurality of direct-current (DC) currents whose respective magnitudes have a specific ratio with respect to each other. The digital-to-analog converter has a filter characteristic that depends on this specific ratio, which will be referred to as current magnitude ratio hereinafter. The current magnitude ratio thus defines the filter characteristic of the digital-to-analog converter. In effect, the aforementioned DC currents constitute filter coefficients of a finite impulse response filter. The aforementioned DC currents may therefore be referred to as filter coefficient currents.

Ideally, the current magnitude ratio should be equal to a desired current magnitude ratio that corresponds with a desired filter characteristic, which provides a signal quality that is optimum. The signal quality will be sub-optimal if the current magnitude ratio deviates from the desired current magnitude ratio. The greater the extent to which the current magnitude ratio deviates from the desired current magnitude ratio, the more the signal quality will deteriorate.

The current magnitude ratio can be defined in the following manner. A current definition cell generates a basic current and a plurality of current copy cells provide scaled copies of the basic current in a current-mirror like fashion. More specifically, the basic current flows through a transistor in the current definition cell, which generates a current copy voltage. A transistor in a current copy cell, which receives the current copy voltage, provides a scaled copy of the basic current. Each filter coefficient current is a scaled copy of the same basic current. Respective transistor dimensions in the current definition cell and the current copy cells define the current magnitude ratio. The aforementioned prior art defines the current magnitude ratio in such a manner.

The prior-art manner of defining the current magnitude ratio generally requires a relatively large circuit surface. Two factors account for this. Firstly, there is a certain resolution with which dimensions of an electrical component can be defined. For example, let it be assumed that a manufacturing process provides a resolution of 0.1 micrometer. Let it further be assumed that a transistor has a nominal width of 2 micrometers. In that case, the actual width may be 1.9 micrometers or 2.1 micrometers. Secondly, the ratio between the smallest filter coefficient and the largest filter coefficient may be relatively large, such as, for example, 1:30. The desired current magnitude ratio between the smallest filter coefficient current and the largest filter coefficient current, which is equal to the aforementioned filter coefficient ratio, will equally be relatively large.

The transistor dimensions that determine the smallest filter coefficient current should be sufficiently large to ensure that the current magnitude ratio is sufficiently close to the desired current magnitude ratio despite the resolution, which is limited. For example, let it be assumed that the resolution is 0.1 micrometer and that the current magnitude ratio should not deviate more than 2% from the desired current magnitude ratio. Let it further be assumed that respective transistor widths determine respective filter coefficient current magnitudes. In that case, the smallest filter coefficient current requires a transistor width of 5 micrometers; 0.1 micrometer is 2% of 5 micrometers.

In the prior art, there is a fixed relationship between the transistor dimensions that determine the largest filter coefficient current and the transistor dimensions that determine the smallest filter coefficient current. The transistor dimensions that determine the largest filter coefficient current depend on the desired current magnitude ratio between smallest filter coefficient current and the largest filter coefficient current. For example, let it be assumed that the smallest filter coefficient current requires a transistor width of 5 micrometers for the reasons mentioned hereinbefore. Let it further be assumed that the ratio between the smallest filter coefficient and the largest filter coefficient is 1:30. In that case, the largest filter coefficient current requires a transistor width of 150 micrometers. This example illustrates that a relatively precise current magnitude ratio requires a relatively large circuit surface mainly because of the resolution, which is limited, and the fixed relationship between the transistor dimensions that determine the largest filter coefficient current and the transistor dimensions that determine the smallest filter coefficient current.

In accordance with the aforementioned aspect of the invention, a digital-to-analog converter comprises at least two current source arrays. In a current source array, a current definition cell generates a basic current, and a plurality of current copy cells provide respective scaled copies of the basic current. The respective scaled copies from the at least two current source arrays constitute filter coefficient currents.

Since, in accordance with the invention, there are at least two distinct current source arrays, there is no longer a fixed relationship between the transistor dimensions that determine the largest filter coefficient current and the transistor dimensions that determine the smallest filter coefficient current. One current source array may provide the largest filter coefficient current, whereas another current source array may provide the smallest filter coefficient current. Consequently, the transistor dimensions that determine the smallest filter coefficient current can be relatively large without this automatically necessitating a relatively large circuit surface. That is, the invention allows an increase of the transistor dimensions that determine the smallest filter coefficient current for a given circuit surface. This allows a more precise current magnitude ratio for a given resolution and a given circuit surface. In this respect, it should be noted that will be a certain mismatch between the current source arrays. This mismatch will introduce an error in the current magnitude ratio. It has been found that this error is relatively small compared with an error reduction associated with the aforementioned increase in the transistor dimensions that determine the smallest filter coefficient current. It has been explained hereinbefore that the more precise the current magnitude ratio is, the more precise the filter characteristics are, and the better the signal quality is. For those reasons, the invention allows a relatively good signal quality at moderate cost.

These and other aspects of the invention will be described in greater detail hereinafter with reference to drawings.

DETAILED DESCRIPTION

Figure 1:
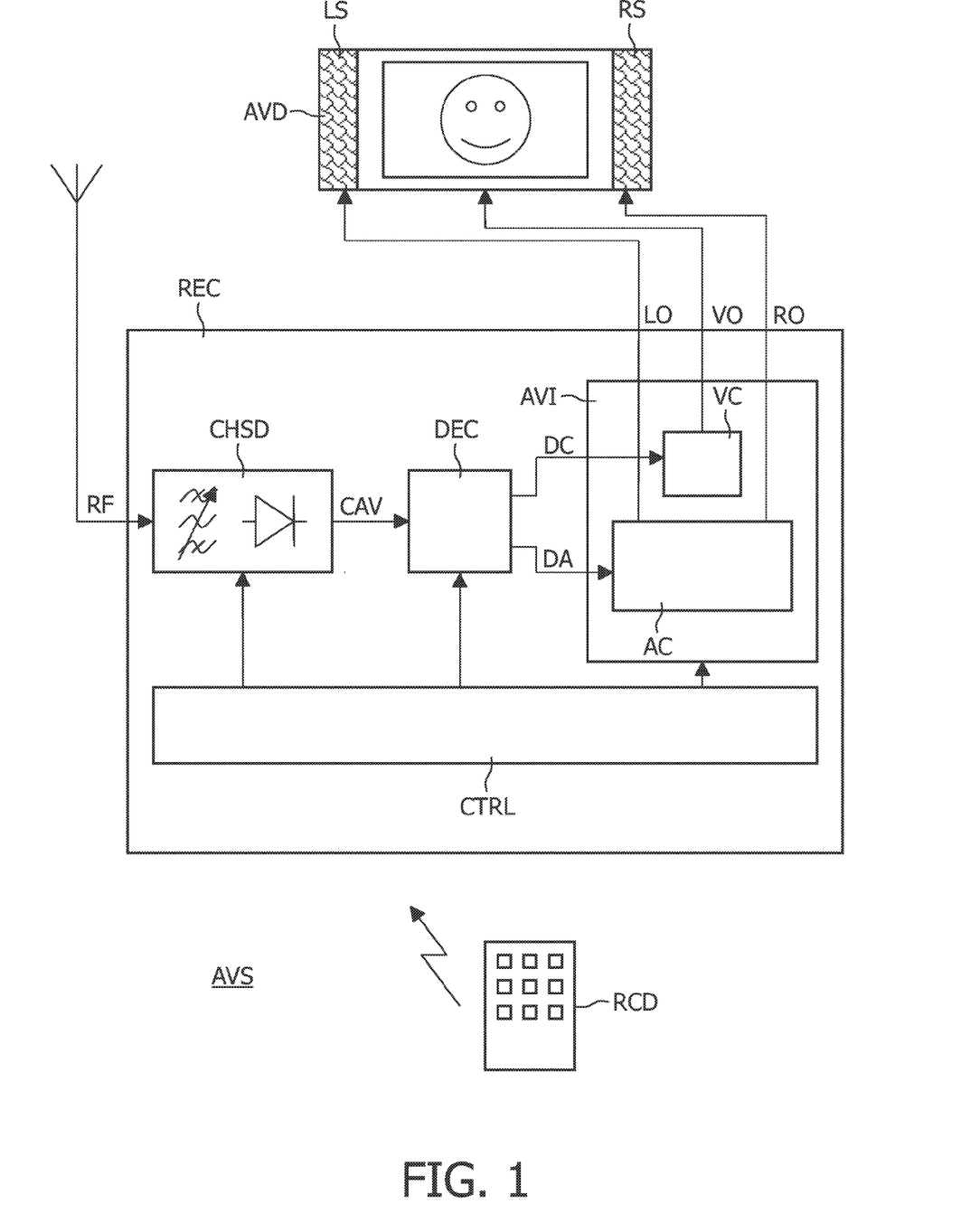
FIG. 1 is a block diagram that illustrates an embodiment of an audiovisual system.

FIG. 1 illustrates an embodiment of an audiovisual system AVS. The audiovisual system AVS comprises an audiovisual rendering device AVD, a receiver REC, and a remote control device RCD. The audiovisual rendering device AVD has a left channel loudspeaker LS and a right channel loudspeaker RS. The audiovisual rendering device AVD may further comprise, for example, a flat panel display. The left channel loudspeaker LS and the right channel loudspeaker RS render a left channel audio output signal LO and a right channel audio output signal RO, respectively, which the receiver REC provides. The flat panel display renders a video output signal VO that the receiver REC provides. The receiver REC may be in the form of, for example, a settop box, a digital video recorder, a television set, or a board, which can be plugged into a personal computer or any other multimedia device. The audiovisual rendering device AVD and the receiver REC may form one apparatus or may be separate entities.

The receiver REC comprises the following functional entities: a channel selector-and-detector CHSD, a decoder DEC, an audiovisual interface AVI, and a controller CTRL. The audiovisual interface AVI comprises an audio circuit AC and a video circuit VC. The channel selector-and-detector CHSD may comprise a tuner module, which typically has a tin can housing. The controller CTRL may be in the form of a suitably programmed microprocessor. Each of the aforementioned functional entities may comprise one or more integrated circuits. The functional entities may form part of a single board on which the integrated circuits are mounted.

The receiver REC basically operates as follows. The receiver REC receives a radiofrequency spectrum RF that comprises various channels. A user can select a particular channel by means of, for example, the remote control device RCD. In response to a channel selection, the controller CTRL tunes the channel selector-and-detector CHSD to the channel that the user has selected. The channel selector-and-detector CHSD derives coded audiovisual data CAV from the channel that the user has selected. The coded audiovisual data CAV may be, for example, audiovisual data that has been encoded in accordance with the MPEG 2 standard at a transmitting end (MPEG is an acronym for Moving Pictures Expert Group). The decoder DEC, which decodes the coded audiovisual data CAV, provides digital audio data DA and digital video data DV.

The audiovisual interface AVI receives the digital audio data DA and the digital video data DV that the decoder DEC provides. The audiovisual interface AVI may receive other digital audio data and other digital video data from other audiovisual sources, which are not shown in FIG. 1. For example, the audiovisual interface AVI may receive digital audio data and digital video data from a digital versatile disk (DVD) apparatus, which is coupled to the receiver REC. The user can select a particular audiovisual source to provide the left channel audio output signal LO, the right channel audio output signal RO, and the video output signal VO for the audiovisual rendering device AVD. In response to a source selection, the controller CTRL causes the audiovisual interface AVI to establish the aforementioned output signals on the basis of the source that the user has selected. It will be assumed hereinafter that the audiovisual interface AVI establishes the left channel audio output signal LO and the right channel audio output signal RO on the basis of the digital audio data DA that the decoder DEC provides.

Figure 2:
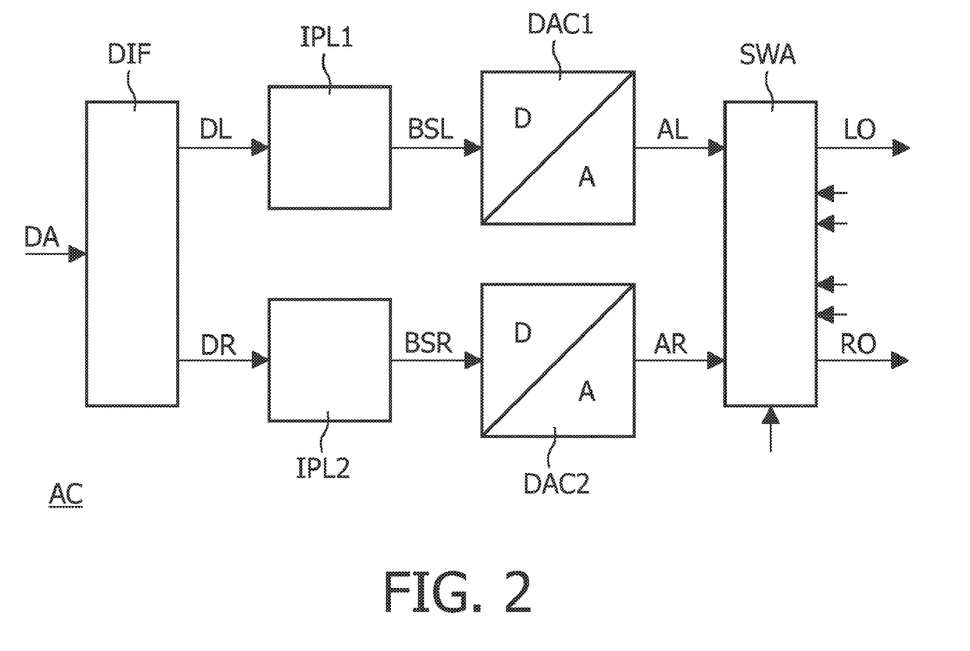
FIG. 2 is a block diagram that illustrates an embodiment of an audio circuit, which forms part of the audiovisual system.

FIG. 2 illustrates an embodiment of the audio circuit AC of the audiovisual interface AVI. The audio circuit AC comprises the following functional entities: a digital interface DIF, two interpolators IPL1, IPL2, two digital-to-analog converters DAC1, DAC2, and a switching arrangement SWA. These functional entities may be comprised in, for example, a single integrated circuit. Each of the two digital-to-analog converters DAC1, DAC2 is a so-called finite impulse response digital-to-analog converter (FIRDAC).

It is assumed that the digital audio data DA, which the audio circuit AC receives, is in the form of a serial bitstream in the I2S format. The I2S format is an industry standard, which was invented by Philips. The serial bitstream, which is in the I2S format, alternately comprises a sequence of left channel audio bits and a sequence of right channel audio bits. Each sequence begins with the most significant bit and ends with the least significant bit.

The audio circuit AC operates as follows. The digital interface DIF converts the digital audio data DA, which in the I2S format, into a left channel digital audio signal DL and a right channel digital audio signal DR. The left channel digital audio signal DL is a stream of digital audio samples. Each digital audio sample comprises 20 bits. The left channel digital audio signal DL has a sample frequency of 44.1 kHz. The aforementioned equally applies to the right channel digital audio signal DR. The digital interface DIF can be regarded as a bit-serial to bit-parallel converter, which, in addition, separates left and right channel audio.

Interpolator IPL1 converts the left channel digital audio signal DL into a left channel audio bitstream BSL. The left channel audio bitstream BSL is a 1-bit representation of the left channel digital audio signal DL. In effect, the left channel audio bitstream BSL can be regarded as a stream of digital audio samples, whereby each digital audio sample comprises 1 bit only. The left channel audio bitstream BSL has a magnitude resolution of 1 bit, whereas the left channel digital audio signal DL has a magnitude resolution of 20 bits. The left channel audio bitstream BSL has a sample frequency of 2.8224 MHz, which is 64 times the sample frequency of the left channel digital audio signal DL. Interpolator IPL1 exchanges, as it were, time resolution for magnitude resolution. In doing so, interpolator IPL1 carries out a so-called noise shaping operation. The noise shaping operation pushes, as it were, quantization noise beyond 20 kHz, which is a typical upper boundary of an audio band. Interpolator IPL2 converts the right channel digital audio signal DR into a right channel audio bitstream BSR in a similar fashion.

Digital-to-analog converter DAC1 converts the left channel audio bitstream BSL into a left channel analog audio signal AL. It has been mentioned hereinbefore that digital-to-analog converter DAC1 is a finite impulse response digital-to-analog converter (FIRDAC). Digital-to-analog converter DAC1 has a low-pass filter characteristic with a cut-off frequency that corresponds with the upper boundary of the audio band, which is typically 20 kHz. Accordingly, digital-to-analog converter DAC1 attenuates the quantization noise, which is substantially outside the audio band, to a relatively large extent. Digital-to-analog converter DAC1 should preferably not introduce any frequency distortion, or any other distortions, within the audio band. The aforementioned equally applies to digital-to-analog converter DAC2, which converts the right channel audio bitstream BSR into a right channel analog audio signal AR.

The switching arrangement SWA receives the left channel analog audio signal AL and the right channel analog audio signal AR. The switching arrangement SWA may receive other audio signals from other sources, which are not shown in FIG. 2. The controller CTRL of FIG. 1 causes the switching arrangement SWA to provide a particular audio signal as the left channel audio output signal LO and another particular audio signal as the right channel audio output signal RO. It has been assumed hereinbefore that the left channel audio output signal LO and the right channel audio output signal RO are based on the digital audio data DA, which the decoder DEC illustrated in FIG. 1 provides. Accordingly, the left channel audio output signal LO corresponds with the left channel analog audio signal AL and the right channel audio output signal RO corresponds with the right channel analog audio signal AR.

The two digital-to-analog converters DAC1, DAC2 determine audio quality to a considerable extent. It is generally possible to process digital signals in a precise manner without introducing any distortion. This is because digital signal processing is substantially insensitive to component tolerances. Consequently, the left channel audio bitstream BSL and the right channel audio bitstream BSR can therefore precisely represent a left channel audio signal and a right channel audio signal, respectively, at a transmitting end.

Any distortion in the left channel audio output signal LO and the right channel audio output signal RO will substantially be due to the two digital-to-analog converters DAC1, DAC2, which are sensitive to component tolerances. Ideally, the low-pass filter characteristic of each of the two digital-to-analog converters DAC1, DAC2 should exactly correspond with an optimum low-pass filter characteristic. Component tolerances cause the low-pass filter characteristic to deviate from the optimum low-pass filter characteristic. Such a deviation deteriorates signal quality.

Figure 3:
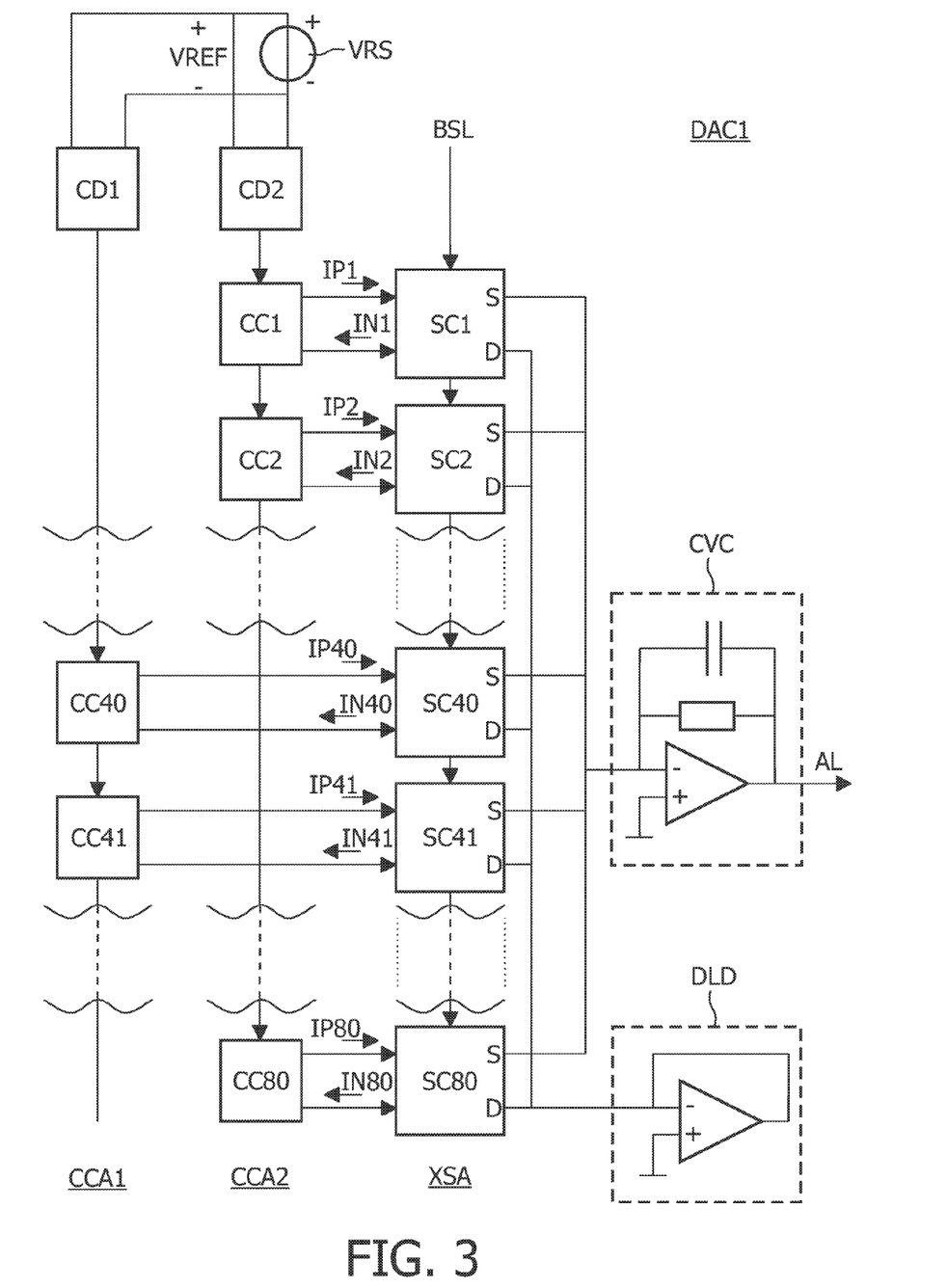
FIG. 3 is a block diagram that illustrates an embodiment of a digital-to-analog converter, which forms part of the audio circuit of the audiovisual system.

FIG. 3 illustrates an embodiment of a digital-to-analog converter DAC1. Digital-to-analog converter DAC1 comprises a reference voltage source VRS, two current source arrays CCA1, CCA2, a switch-and-shift array XSA, a current-to-voltage converter CVC, and a dummy load DLD. The two current source arrays CCA1, CCA2 are of similar structure. Current source array CCA1 comprises a current definition cell CD1 and various current copy cells CC, two of which CC40, CC41 are shown. Similarly, current source array CCA2 comprises a current definition cell CD2 and various current copy cells CC, three of which CC1, CC2, CC80 are shown. The current definition cell CD1 of current source array CCA1 and the current definition cell CD2 of current source array CCA2 both receive a reference voltage VREF from the reference voltage source VRS.

The switch-and-shift array XSA comprises eighty switch-and-shift cells SC, five of which SC1, SC2, SC40, SC41, SC80 are shown. Each switch-and-shift cell SC has a signal output S and a dummy output D. Each switch-and-shift cell is coupled to a particular current copy cell that either forms part of current source array CCA1 or current source array CCA2. Consequently, the total number of all the current copy cells in the digital-to-analog converter DAC1 is equal to 80. The current copy cells are distributed among current source array CCA1 and current source array CCA1. Digital-to-analog converter DAC2 has an identical structure and operates in an identical fashion.

Digital-to-analog converter DAC1 operates as follows. Switch-and-shift cell SC1 reads a new bit from the left channel audio bitstream BSL with each clock cycle in a clock signal that corresponds with the sample frequency in the left channel audio bitstream BSL, which is 2.8224 MHz. Let it be assumed that switch-and-shift cell SC1 reads a first bit from the left channel audio bitstream BSL at the start of a first clock cycle. Switch-and-shift cell SC1 stores the first bit during the first clock cycle. Subsequently, switch-and-shift cell SC2 reads the first bit from the left channel audio bitstream BSL at the start of a second clock cycle, which succeeds the first clock cycle. Switch-and-shift cell SC2 stores the first bit during the second clock cycle. Accordingly, the first bit moves one position downwards in the switch-and-shift array XSA with each clock cycle. The first bit will reach switch-and-shift cell SC80 at an $80^{th}$ clock cycle. Accordingly, each bit in the left channel audio bitstream BSL enters, as it were, the switch-and-shift array XSA and travels through the switch-and-shift array XSA at a rate that corresponds with a sample frequency in the left channel audio bitstream BSL.

Accordingly, each switch-and-shift cell SC in the switch-and-shift array XSA comprises a particular bit of the left channel audio bitstream BSL in an order that corresponds with the order in which the bits occur in the left channel audio bitstream BSL. At any given clock cycle, switch-and-shift cell SC1 comprises a K-th bit of the left channel audio bitstream BSL, switch-and-shift cell SC2 comprises a K+1-th bit, switch-and-shift cell SC40 a K+40-th bit, switch-and-shift cell SC41 a K+41-th bit, and switch-and-shift cell SC80 a K+80-th bit, K being an arbitrary integer.

The switch-and-shift array XSA receives direct-current (DC) currents IP1, IP2, . . . , IP40, IP41, . . . , IP80 and inverse DC currents IN1, IN2, . . . , IN40, IN41, . . . , IN80 from the two current source arrays CCA1, CCA2. More specifically, each respective switch-and-shift cell receives a DC current and an inverse DC current from the particular current copy cell to which the switch-and-shift cell is coupled. The particular current copy cell either belongs to current source array CCA1 or current source array CCA2. The DC current and the inverse DC current, which each respective switch-and-shift cell receives, have substantially identical magnitudes.

The respective magnitudes of the DC currents IP1, IP2, . . . , IP40, IP41, . . . , IP80 have a specific ratio with respect to each other. The same applies to the respective magnitudes of the inverse DC currents IN1, IN2, . . . , IN40, IN41, . . . , IN80, which have the same specific ratio with respect to each other. This specific ratio will be referred to as current magnitude ratio hereinafter. The current magnitude ratio determines the low-pass filter characteristic of digital-to-analog converter DAC1, which has been mentioned hereinbefore. The respective magnitudes of the respective DC currents IP1, IP2, . . . , IP40, IP41, . . . , IP80 and the respective inverse DC currents IN1, IN2, . . . , IN40, IN41, . . . , IN80 correspond with filter coefficients of a finite impulse response filter. The aforementioned currents will therefore hereinafter be referred to as filter coefficient currents IP1, IP2, . . . , IP40, IP41, . . . , IP80 and inverse filter coefficient currents IN1, IN2, . . . , IN40, IN41, . . . , IN80, respectively. Accordingly, each current copy cell provides a filter coefficient current pair, which comprises a filter coefficient currents and an inverse filter coefficient current.

Switch-and-shift cell SC1 receives filter coefficient current IP1 and inverse filter coefficient current IN1 from current copy cell CC1, which forms part of current source array CCA2. Switch-and-shift cell SC1 directs filter coefficient current IP1 to its signal output S and inverse filter coefficient current IN1 to its dummy output D, if the bit that switch-and-shift cell SC1 stores is equal to one (1). Conversely, switch-and-shift cell SC1 directs inverse filter coefficient current IN1 to its signal output S and filter coefficient current IP1 to its dummy output D, if the aforementioned bit is equal to zero (0). The other switch-and-shift cells operate in similar fashion. For example, switch-and-shift cell SC40 receives filter coefficient current IP40 and inverse filter coefficient current IN40 from current copy cell CC40, which forms part of current source array CCA1. Switch-and-shift cell SC40 directs filter coefficient current IP40 to its signal output S and inverse filter coefficient current IN40 to its dummy output D, if the bit that switch-and-shift cell SC40 stores is equal to one (1). Conversely, switch-and-shift cell SC40 directs inverse filter coefficient current IN40 to its signal output S and filter coefficient current IP40 to its dummy output D, if the aforementioned bit is equal to zero (0).

The current-to-voltage converter CVC receives a signal current that is the sum of respective filter coefficient currents and respective inverse filter coefficient currents that the respective switch-and-shift cells SC1, SC2, . . . , SC40, SC41, . . . , SC80 direct to their respective signal outputs S. Consequently, the signal current has a magnitude that depends on two factors. Firstly, the magnitude of the signal current depends on the respective values (0/1) of the respective bits that are stored in the switch-and-shift array XSA at a given instant. This is a variable factor that depends on respective bit values that occur within the left channel audio bitstream BSL. Secondly, the magnitude of the signal current depends on the aforementioned current magnitude ratio, which applies to the respective filter coefficient currents IP1, IP2, . . . , IP40, IP41, . . . , IP80 and the respective inverse filter coefficient currents IN1, IN2, . . . , IN40, IN41, . . . , IN80. This is a constant factor. The current-to-voltage converter CVC converts the signal current into a signal voltage, which constitutes the left channel analog audio signal AL.

The dummy load DLD receives a complementary signal current that is the sum of respective filter coefficient currents and respective inverse filter coefficient currents that the respective switch-and-shift cells SC1, SC2, . . . , SC40, SC41, . . . , SC80 direct to their dummy outputs D. The sum of the signal current, which the current-to-voltage converter CVC receives, and the complementary signal current is always substantially equal to zero (0). For example, let it be assumed that the respective bits that are stored in the switch-and-shift array XSA are all equal to one (1). In that case, the signal current, which the current-to-voltage converter CVC receives, is the sum of all the respective filter coefficient currents IP1, IP2, . . . , IP40, IP41, . . . , IP80 that the two current source arrays CCA1, CCA2 provide. The complementary signal current is equal to the sum of all the respective inverse filter coefficient currents IN1, IN2, . . . , IN40, IN41, . . . , IN80 that the two current source arrays CCA1, CCA2 provide. Each filter coefficient current is paired with an inverse filter coefficient current of substantially identical magnitude. As a result, the signal current, which the current-to-voltage converter CVC receives, and the complementary signal current, which the dummy load DLD receives, have the same magnitude and are of opposite sign. Consequently, the sum of the aforementioned currents is equal to zero (0.)

Current source array CCA1 provides filter coefficient currents and inverse filter coefficient currents that have a relatively large magnitude. Current source array CCA2 provides filter coefficient currents and inverse filter coefficient currents that have a relatively small magnitude. Consequently, current source array CCA1 provides the largest among the respective filter coefficient currents and, of course, the largest among the respective inverse filter coefficient currents. Current source array CCA2 provides the smallest among the respective filter coefficient currents and, of course, the smallest among the respective inverse filter coefficient currents.

For example, let it be assumed that the ratio between the smallest filter coefficient current and the largest filter coefficient current is 1:30. In that case, current source array CCA1 may provide respective filter coefficient currents whose magnitude is comprised between that of the largest filter coefficient current and an intermediate magnitude, which is five times less than the magnitude of the largest filter coefficient current. Current source array CCA2 may provide respective filter coefficient currents whose magnitude is comprised between that of the aforementioned intermediate magnitude and the magnitude of the smallest filter coefficient current. The magnitude of the smallest filter coefficient current is six times less than the intermediate magnitude. Current source array CCA1 will thus provide respective filter coefficient currents with a smallest-largest magnitude ratio of 1:5. Current source array CCA2 will provide respective filter coefficient currents with a smallest-largest magnitude ratio of 1:6. The aforementioned equally applies to the respective inverse filter coefficient currents, each of which is paired with a particular filter coefficient current.

Figure 4:
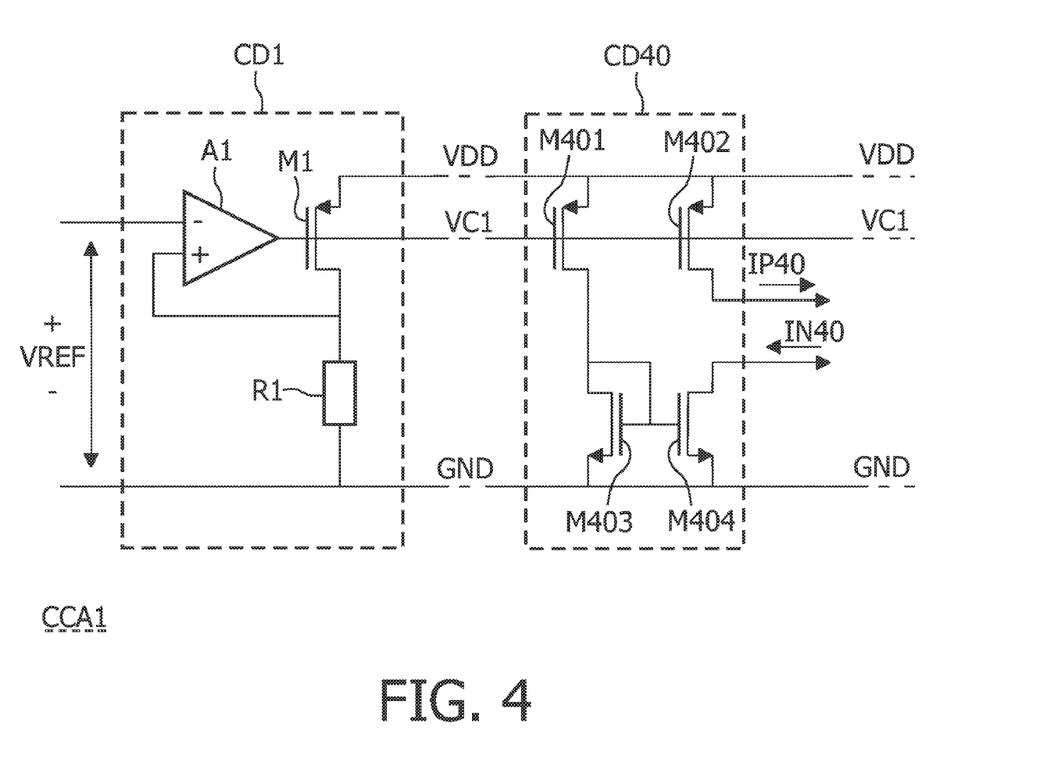
FIG. 4 is a circuit diagram that illustrates an embodiment of a current source array, which forms part of the digital-to-analog converter.

FIG. 4 illustrates an embodiment of a current source array CCA1, which comprises the current definition cell CD1 and current copy cell CC40. The current definition cell CD1 comprises an amplifier A1, a transistor M1, and a resistance R1, which has a specific value. Current copy cell CC40 comprises four transistors M401, M402, M403, M404. The transistor M1 of the current definition cell CD1 and transistors M401, M402 of the current copy cell CC40 are of the PMOS type. Transistors M403, M404 of the current copy cell CC40 are of the NMOS type. Each transistor has a gate, a source, and a drain. A channel, which extends from the source to the drain, is present beneath the gate. Consequently, each transistor has a particular channel width and a particular channel length.

Current source array CCA1 operates as follows. The amplifier A1 receives the reference voltage VREF at a negative input and a voltage across the resistor R1 at a positive input. The voltage across the resistor R1 is equal to a main current that flows through the transistor M1 multiplied by the specific value of the resistance R1. The amplifier A1, the transistor M1, and the resistance R1 constitute a feedback loop. The feedback loop has a steady-state condition in which the voltage across the resistor R1 is substantially equal to the reference voltage VREF. Consequently, the main current, which flows through the transistor M1, is equal to the reference voltage VREF divided by the specific value of the resistance R1. The main current will be referred to as basic current hereinafter. The gate of the transistor M1 has a specific voltage, which represents the basic current that flows through the transistor M1. This specific voltage constitutes a current copy voltage VC1 within current source array CCA1.

Transistor M401, which form part of current copy cell CC40, receives the current copy voltage VC1 at its gate. A main current will flow through transistor M401. The main current has a specific magnitude ratio with respect to the basic current that flows through the transistor M1 of the current definition cell CD1. That is, the main current that flows through transistor M401 is a scaled copy of the basic current. The respective channel widths and the respective channel lengths of transistor M401 and the transistor M1 in the current definition cell CD1 determine the aforementioned specific magnitude ratio. The aforementioned equally applies to transistor M402, through which a main current will flow. Transistors M401, M402 have substantially identical dimensions. Consequently, the respective main currents, which flow through these transistors, are substantially identical.

Transistors M403, M404 constitute a current mirror, which receives the scaled copy current that flows through transistor M401. This causes a main current to flow through transistor M404, which has the same magnitude as the main current that flows through transistor M401, but which is of opposite sign. The main current that flows through transistor M404 constitutes inverse filter coefficient current IN40, which current copy cell CC40 provides. The main current that flows through transistor M402 constitutes filter coefficient current IP40, which current copy cell CC40 provides. Filter coefficient current IP40 and inverse filter coefficient current IN40, which form a filter coefficient current pair, are scaled copies of the basic current that flows through the transistor M1 in the current definition cell CD1.

The other current copy cells that are present in the current source array CCA1 provide respective filter coefficient currents and respective inverse filter coefficient currents in a similar fashion. That is, each current copy cell comprises a pair of transistors that receives the current copy voltage VC1 at the respective gates. These transistors have respective channels of the same width and the same length. The channel width and the channel length of these transistors with respect to the channel width and the channel length of the transistor M1 in the current definition cell CD1, defines a specific magnitude ratio between the filter coefficient current pairs, which the current copy cell provides, and the basic current that flows through the transistor M1 in the current definition cell CD1.

Current source array CCA2 has a structure that is similar to that of current source array CCA1, which FIG. 4 illustrates, and operates in a similar fashion. The current definition cell CD2 of current source array CCA2 will have a resistance comparable with the resistance R1 in FIG. 4. This resistance of current definition cell CD2 will have a specific value that is higher than the specific value of the resistance R1 in current definition cell CD1. Consequently, current definition cell CD2 will generate a basic current that is lower than the basic current that current definition cell CD1 generates. This is because current source array CCA2 provides respective filter coefficient current pairs whose respective magnitudes are relatively small compared with the respective magnitude of the respective filter coefficient current pairs that current source array CCA1 provides.

For example, the basic current that the current definition cell CD2 of current source generates may be five times less than the basic current that the current definition cell CD1 of current source array CCA1 generates. Such a basic current ratio is suitable when the ratio between the smallest filter coefficient current and the largest filter coefficient current is 1:30, as mentioned hereinbefore by way of example. In this example, current source array CCA1 provides respective filter coefficient currents with a smallest-largest magnitude ratio of 1:5. Current source array CCA2 provides respective filter coefficient currents with a smallest-largest magnitude ratio of 1:6.

It has been explained hereinbefore that the current magnitude ratio, which applies to the respective filter coefficient current pairs that the switch-and-shift array XSA receives, define the low-pass filter characteristics of digital-to-analog converter DAC1. Two factors define the current magnitude ratio. Firstly, the ratio between the resistance R1 of the current definition cell CD1 in current source array CCA1, which FIG. 4 illustrates, and the resistance of the current definition cell CD2 in current source array CCA2, defines the current magnitude ratio. Secondly, the respective channel widths and the respective channel lengths of the respective transistors in the respective current copy cells determine the current magnitude ratio. The respective channel lengths are preferably identical; the only difference resides in the respective channel widths.

Both aforementioned factors, which define the low-pass filter characteristic, are imprecise to a certain extent. This is due to manufacturing tolerances. Perfect matching does not exist in practice. It is not possible to manufacture two components that have exactly the same characteristics or that have different characteristics in an exact ratio. Consequently, manufacturing tolerances may cause the low-pass filter characteristics of the digital-to-analog converter DAC1 to deviate from the optimum low-pass filter characteristic. Such a deviation introduces distortion.

In view of the aforementioned, it may seem strange that digital-to-analog converter DAC1 comprises more than one current source array. Let it be assumed that there was a single current source array only. In that case, there is only one factor that defines the low-pass filter characteristic: the respective channel widths and the respective channel lengths in the respective current copy cells of the single current source array. Any resistance mismatch will not affect the low-pass filter characteristic. Accordingly, one would expect better precision and, therefore, less distortion. However, this is generally not true.

In general, a digital-to-analog converter of the FIRDAC type that comprises various current source arrays, will generally perform better than a digital-to-analog converter that has a single current source array only. One reason for this relates to the following aspect. In practice, there is certain resolution with which dimensions of an electrical component can be defined. Consequently, a channel width and a channel length can be defined with a resolution, which is manufacturing process dependent. The better resolution is, the more precise the current magnitude ratio is and, consequently, the more precise the low-pass filter characteristic is.

Let it be assumed that a digital-to-analog converter of the FIRDAC type has a smallest-largest filter coefficient ratio of 1:30. Let it further be assumed that the digital-to-analog converter comprises a single current source array only. Let it further be assumed that the smallest transistor in the single current source array has a nominal channel width of 2 micrometers and that the largest transistor has a nominal channel width of 60 micrometers, and that all transistors have the same channel length. There is a nominal smallest-largest channel width ratio of 1:30, which corresponds with the smallest-largest filter coefficient ratio. Let it further be assumed that the channel width and the channel length can be defined with 0.1 micrometer resolution.

In the aforementioned single current source array example, the smallest transistor in the single current source array may have an actual channel width of 1.9 micrometers and the largest transistor may have an actual channel width of 59.9 micrometers. There is an actual smallest-largest channel width ratio of approximately 1:31.5. The 0.1 micrometer resolution introduces a channel width ratio error of 5%. Increasing transistor sizes reduces the channel width ratio error. This solution requires relatively large circuit surface and is therefore relatively costly. Moreover, a larger circuit surface may not always be possible.

In the digital-to-analog converter DAC1 of FIG. 3, current source array CCA1 may provide respective filter coefficient currents with a smallest-largest magnitude ratio of 1:5. This can be achieved with a smallest-largest channel width ratio of 1:5, assuming that the respective transistors have the same channel length. Current source array CCA2 may provide respective filter coefficient currents with a smallest-largest magnitude ratio of 1:6. This can be achieved with a smallest-largest channel width ratio of 1:6, assuming that the respective transistors have the same channel length. Consequently, the smallest-largest channel width ratio of each of the aforementioned current source arrays is relatively small compared with the smallest-largest channel width of the single current source array described hereinbefore.

In each of the aforementioned current source arrays, the smallest transistor can have a relatively large channel width without the largest transistor being too large. For example, the channel width of the smallest transistor in current source array CCA1 can be 5 micrometers. In that case, the channel width of the largest transistor in current source array CCA1 should be 25 micrometers. There will be a channel width ratio error of approximately 2%, which is substantially less than the channel width ratio error of 5%, which occurs in the single current source array described hereinbefore, by way of example. Consequently, the digital-to-analog converter DAC1, which FIG. 4 illustrates, is less sensitive to manufacturing tolerances than a conventional digital-to-analog converter with a single current source array only.

CONCLUDING REMARKS

The detailed description hereinbefore with reference to the drawings illustrates the following characteristics, which are cited in various independent claims. In a signal processing arrangement, a digital-to-analog converter (DAC1) of the finite impulse response type converts a serial bitstream (BSL) into an analog output signal (AL). The digital-to-analog converter (DAC1) comprises at least two current source arrays (CCA1, CCA2). In a first current source array (CCA1), a current definition cell (CD1) generates a first basic current, and a plurality of first current copy cells ( . . . , CC40, CC41, . . . ) provide respective scaled copies of the first basic current to constitute first filter coefficient currents ( . . . , IP40, IP41, . . . ). In a further current source array (CCA2), a further current definition cell (CD2) generates a further basic current, and a plurality of current further copy cells (CC1, CC2, . . . , CC80) provide respective scaled copies of the further basic current to constitute further filter coefficient currents (IP1, IP2, . . . , IP80). A switch-and-shift array (XSA) individually passes the respective filter coefficient currents (IP1, IP2, . . . , IP40, IP41, . . . , IP80) to a signal output (CVC), or to another point (DLD), depending on respective successive bit values in the serial bitstream (BSL).

The detailed description hereinbefore further illustrates various optional characteristics, which are cited in the dependent claims. These characteristics may be applied to advantage in combination with the aforementioned characteristics. Various optional characteristics are highlighted in the following paragraphs. Each paragraph corresponds with a particular dependent claim.

The at least two current source arrays (CCA1, CCA2) receive a common reference voltage (VREF). The current definition cell (CD1; CD2) in each current source array (CCA1; CCA2) generates the basic current on the basis of the common reference voltage (VREF).

The current definition cell (CD1) in a current source array (CCA1) comprises a transistor (M1) that provides a current copy voltage (VC1) in response to the basic current. Each current copy cell ( . . . , CC40, . . . ) in the current source array (CCA1) comprises a transistor ( . . . , M401, . . . ) that provides a scaled copy of the basic current in response to the current copy voltage (VC1).

The transistors in the current definition cell (CD1) and each current copy cell ( . . . , CC40, . . . ) are of the field effect type.

The transistors in the current definition cell (CD1) and each current copy cell ( . . . , CC40, . . . ) have a substantially identical channel length.

Each of the aforementioned sets of characteristics contributes to a relatively precise current magnitude ratio and, therefore, contributes to a relatively good signal quality.

Each current source array (CCA1; CCA2) provides respective pairs of scaled copies of the basic current in the current source array. A pair of scaled copies comprises a scaled copy of the basic current and the inverse of that scaled copy. This set of characteristics allows a balanced operation, which reduces interference and, therefore, contributes to relatively good signal quality.

The aforementioned characteristics can be implemented in numerous different manners. In order to illustrate this, some alternatives are briefly indicated.

A digital-to-analog converter in accordance with the invention may be used in any type of signal processing. Audio signal processing is merely an example. The term "signal processing arrangement" should be construed broadly. For example, the receiver REC of FIG. 1 constitutes a signal processing arrangement. The audio circuit AC of FIG. 2 similarly constitutes a signal processing arrangement, which is of lower rank.

A digital-to-analog converter in accordance with the invention may comprise more than two current source arrays. Three or more current source arrays may be advantageous if there is a relatively large current magnitude ratio between the smallest filter coefficient current and the largest filter coefficient current. A digital-to-analog converter in accordance with the invention may comprise any arbitrary number of switch-and-shift cells. Eighty switch-and-shift cells is merely an example. The point other than the signal output to which the switch-and-shift array may individually pass the respective filter coefficient currents, need not necessarily be a dummy load, or the like. For example, referring to FIG. 3, a further current-to-voltage converter may replace the dummy load DLD so as to obtain a differential signal output.

A current source array can be implemented in numerous different manners. For example, it is possible to use bipolar transistors instead of field effect transistors. A filter coefficient current need not necessarily be paired with an inverse filter coefficient. That is, a current source array may provide single-ended filter coefficient currents instead of pairs of symmetrical filter coefficient currents. It should further be noted that there are numerous different manners to generate a basic current on the basis of a reference voltage. FIG. 4 merely provides an example. It should further be noted that an individual current source array invention may be implemented in accordance with one or more principles that U.S. Pat. No. 6,501,408 describes.

There are numerous ways of implementing functions by means of items of hardware or software, or both. In this respect, the drawings are very diagrammatic, each representing only one possible embodiment of the invention. Thus, although a drawing shows different functions as different blocks, this by no means excludes that a single item of hardware or software, or a single item of hardware and software, carries out several functions. Nor does it exclude that an assembly of items of hardware or software, or an assembly of both such items, carries out a function.

The remarks made herein before demonstrate that the detailed description with reference to the drawings, illustrate rather than limit the invention. There are numerous alternatives, which fall within the scope of the appended claims. Any reference sign in a claim should not be construed as limiting the claim. The word "comprising" does not exclude the presence of other elements or steps than those listed in a claim. The word "a" or "an" preceding an element or step does not exclude the presence of a plurality of such elements or steps. The mere fact that certain measures are recited in mutually different dependent claims does not indicate that a combination of these measures cannot be used to advantage.

The invention claimed is:

1. A signal processing arrangement comprising a digital-to-analog converter of the finite impulse response type for converting a serial bitstream into an analog output signal, the digital-to-analog converter comprising:
   a first current source array comprising a first current definition cell for generating a first basic current, and a plurality of first current copy cells for providing respective scaled copies of the first basic current to constitute first filter coefficient currents;
   at least one further current source array comprising a further current definition cell for generating a further basic current, and a plurality of further current copy cells for providing respective scaled copies of the further basic current to constitute further filter coefficient currents; and
   a switch-and-shift array for individually passing the respective filter coefficient currents to a signal output or to another point, depending on respective successive bit values in the serial bitstream.

2. A signal processing arrangement according to claim 1, the at least two current source arrays being coupled to receive a common reference voltage, the current definition cell in each current source array being arranged to generate the basic current on the basis of the common reference voltage.

3. A signal processing arrangement according to claim 1, the current definition cell in a current source array comprising a transistor arranged to provide a current copy voltage in response to the basic current, each current copy cell in the current source array comprising a transistor arranged to provide a scaled copy of the basic current in response to the current copy voltage.

4. A signal processing arrangement according to claim 3, the transistors in the current definition cell and each current copy cell being of the field effect type.

5. A signal processing arrangement according to claim 4, the transistors in the current definition cell and each current copy cell having a substantially identical channel length.

6. A signal processing arrangement according to claim 1, each current source array being arranged to provide respective pairs of scaled copies of the basic current in the current source array, a pair of scaled copies comprising a scaled copy of the basic current and the inverse of that scaled copy.

7. An information-rendering system comprising:
   a signal processing arrangement according to claim 1, comprising a digital-to-analog converter of the finite impulse response type for converting a serial bitstream into an analog output signal, and
   a rendering device for rendering the analog output signal.

* * * * *